(12) United States Patent
Wieczorek et al.

(10) Patent No.: US 6,436,724 B1
(45) Date of Patent: Aug. 20, 2002

(54) METHOD OF MONITORING THE TEMPERATURE OF A RAPID THERMAL ANNEAL PROCESS IN SEMICONDUCTOR MANUFACTURING AND A TEST WAFER FOR USE IN THIS METHOD

(75) Inventors: Karsten Wieczorek, Reichenberg-Boxdorf; Manfred Horstmann, Dresden; Christian Krüger, Liegau-Augustusbad, all of (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/808,391

(22) Filed: Mar. 14, 2001

(51) Int. Cl.[7] ............................................... H01L 21/66
(52) U.S. Cl. ....................................................... 438/14
(58) Field of Search ................................. 438/149, 166, 438/14, 426

(56) References Cited

U.S. PATENT DOCUMENTS 6,017,779 A * 1/2000 Miyasaka .................... 438/149

* cited by examiner

Primary Examiner—John F. Niebling
Assistant Examiner—Andre' C Stevenson
(74) Attorney, Agent, or Firm—Williams, Morgan & Amerson, P.C.

(57) ABSTRACT

A method of monitoring the temperature of a rapid thermal annealing (RTA) process and a test wafer for use in this process are disclosed. The method includes the step of forming a distorted surface region in a crystalline semiconductor wafer and the mounting of the wafer in a process chamber for performing the RTA process in a reaction gas containing ambient. The distorted surface region of the semiconductor wafer enables higher diffusion rates of reaction gas components into the wafer surface and therefore a higher growth rate of a reaction product film. The increase of the reaction product film thickness enables an increase of the film thickness measurement accuracy and thus the accuracy in determining the RTA temperature homogeneity. In one embodiment, a distorted surface region in a crystalline silicon test wafer is produced by implanting ions at low doses into a wafer substrate up to a pre-amorphization level of the surface crystalline lattice. As a low dose of heavy ions is sufficient for producing the distorted surface region, the test wafers are produced at low costs. Additionally, a method of reworking test wafers that have been used in an RTA monitoring method is presented. By reworking the test wafers and preparing for the next RTA-monitoring the wafer costs can be efficiently reduced.

22 Claims, 1 Drawing Sheet

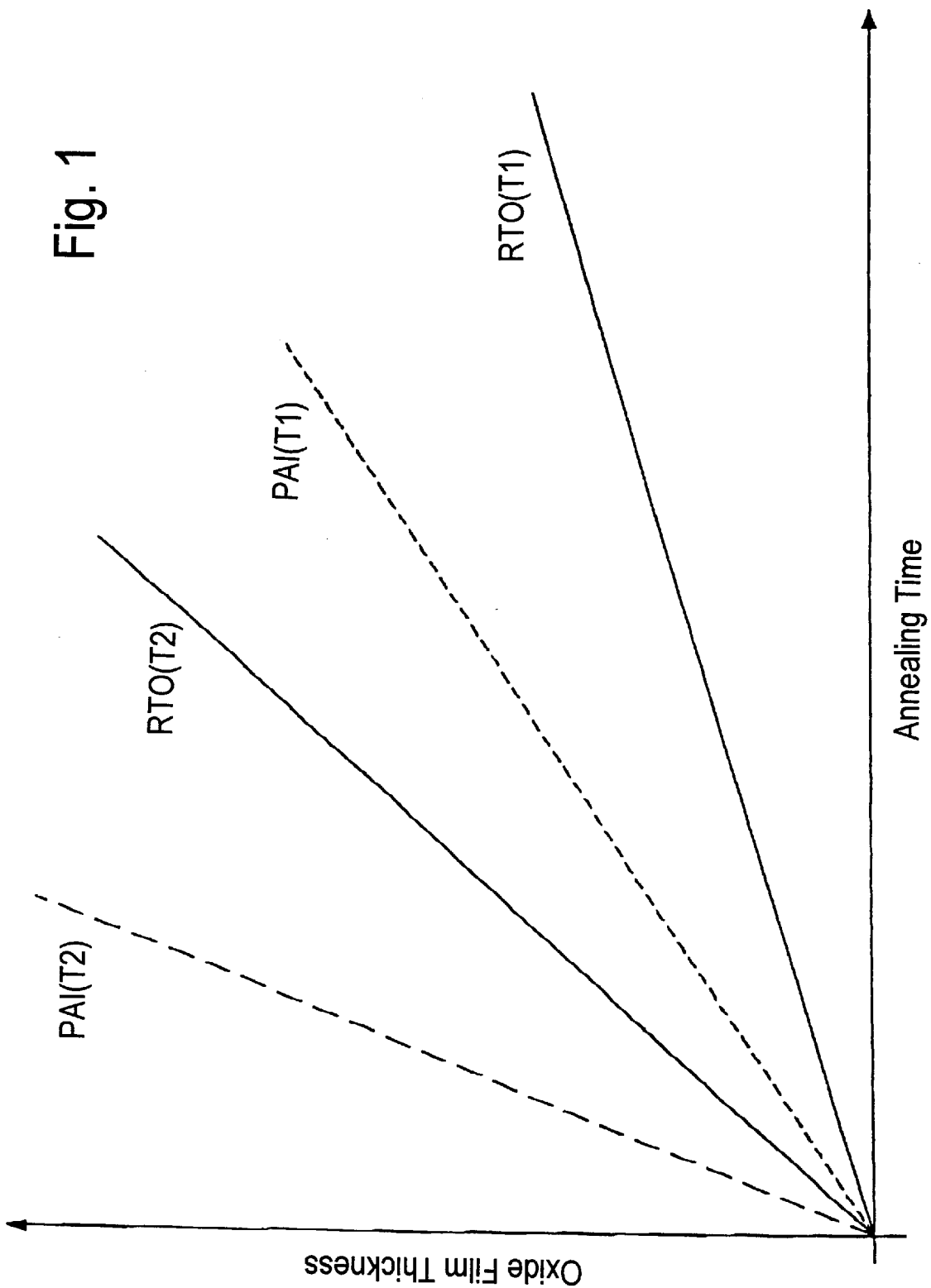

METHOD OF MONITORING THE TEMPERATURE OF A RAPID THERMAL ANNEAL PROCESS IN SEMICONDUCTOR MANUFACTURING AND A TEST WAFER FOR USE IN THIS METHOD

BACKGROUND OF THE INVENTION

1. Field of the Invention

The present invention is generally related to a method of monitoring the temperature of a rapid thermal anneal (RTA) process and a test wafer for use in this method, and more particularly to a method of monitoring the temperature of an RTA process by using a distorted surface structure of a semiconductor wafer in which surface reactions with a ambient reaction gas during an RTA process are induced.

2. Description of the Related Art

In state-of-the-art deep sub-micron CMOS manufacturing methods the accurate monitoring of the physical effects of a rapid thermal annealing (RTA) process on the semiconductor substrate is an indispensable procedure. For a given processing time, e.g. the electrical activation of previously implanted dopants in the semiconductor substrate (e.g., an Si-substrate) is strongly dependent on the temperature during the RTA process. More particularly, any inhomogeneities of the local temperature distribution across a semiconductor substrate during the RTA process will result in considerable local differences of the electrical activation and thus the local electrical conductivity values of doped regions in the semiconductor substrate. Such local variations are not acceptable in semiconductor manufacturing requiring high reproducibility and homogeneity in such RTA processes.

According to one of the conventional RTA temperature monitoring methods, the temperature dependency of the electrical conductivity of the previously ion-implanted semiconductor substrate is used as a measure of the temperature and the homogeneity of the local temperature distribution during the RTA process. In this method, the semiconductor substrate is a crystalline silicon test wafer that is, e.g., implanted by n-doping arsenic (As) ions at a dose of $10^{16}$ ions/cm$^2$ and an implantation energy of 25 keV. The As ions are implanted evenly over the entire surface of the originally undoped and unstructured silicon test wafer. The silicon test wafer is placed in an RTA process chamber as a dummy and after performing the RTA process, the conductivity-dependent sheet resistance is measured at different locations on the silicon test wafer. Due to the strong temperature dependency of the electrical conductivity, variations in the sheet resistance which in turn depends on the electrical conductivity are a good indicator for temperature inhomogeneities. As an example, using the above ion implantation and performing an RTA annealing at 1,000° C. for 30 seconds typically results in a sheet resistance of about 74 $\Omega/\square$(Ohm/Square).

Therefore, the standard monitoring of the RTA temperature is generally based on the resulting electrical activation of implanted dopants in silicon test wafers. However, low implantation doses of the As dopant ions in the silicon test wafers are accompanied by intrinsic variations in the sheet resistance independent of temperature inhomogeneities since implant doses below the solid-solubility limit will superimpose implant inhomogeneities. In this case, the variations of the sheet resistance across the silicon test wafer are a superimposition of variations of the solid-solubility and temperature inhomogeneities so that the reliability of this monitoring method is very limited.

On the other hand, by implanting high ion doses, the effect of this varying solubility on the sheet resistance is minimized. However, a longer implantation time is required for implanting high doses so that the operation time of the ion implanter is essentially increased resulting in high manufacturing costs for the silicon test wafers.

A further drawback of this first conventional monitoring method is that the silicon test wafers can only be used once. Thus, the use of these silicon test wafers as a monitoring means is lengthy and leads to high consumption of expensive test wafers.

In an alternative, second conventional approach for monitoring the RTA process, a mimic RTA process is performed in the RTA process chamber in an oxygen containing ambient. The oxygen is penetrating into the silicon test wafer during the RTA process and forming a silicon oxide surface film on the wafer. After this so-called RTO process (rapid thermal oxidation process), the resulting silicon oxide film thickness is measured as a monitoring means for the RTA process.

In FIG. 1, the solid lines RTO(T1) and RTO(T2) show the theoretical, exemplary time-dependency of the resulting oxide film thickness of this second method for two different RTA temperatures T1 and T2, respectively, wherein the first temperature T1 is lower than second temperature T2. The figure clearly shows that the silicon oxide film thickness is a very distinct function of both the annealing temperature and annealing time. However, this RTO technique is relatively insensitive due to the slow growth rate of the oxide film resulting in low film thickness. Due to the low film thickness, the measurement error of the film thickness measurement is high and the film thickness variations across the test wafer surface which result from temperature inhomogeneities during the RTA process may be hidden and undiscovered within the measurement errors.

Accordingly, there exists a need for a method of monitoring the temperature of an RTA process and a test wafer therefor enabling an accurate determination of the RTA process temperature and temperature distribution while keeping the monitoring costs low.

Further, there is a need to provide a method of reducing the number of consumed test wafers accompanied by a further reduction of monitoring costs.

The present invention is directed to a method that may solve, or reduce, at least some of the problems described above.

SUMMARY OF THE INVENTION

The present invention relates generally to a method of monitoring the temperature of an RTA process and a test wafer for use in this method, wherein a distorted surface structure of a semiconductor wafer is provided in which surface reactions with an ambient reaction gas during the RTA process are induced.

According to the present invention, the method of monitoring the temperature of a RTA process includes the steps of forming a distorted surface region in a semiconductor wafer, mounting the semiconductor wafer in a process chamber for performing the RTA process, performing the RTA process in a reaction gas ambient, and analyzing the reaction product film thickness of the semiconductor wafer. The reaction product film thickness is a sensitive measure for the temperature acting on the semiconductor wafer.

According to another aspect of the invention, a test wafer of a semiconductor material is provided for monitoring an RTA process in a reaction gas containing ambient. The crystalline structure of the semiconductor material is distorted at least in a defined area on one surface up to a predetermined depth. Due to the distorted surface, the penetration rate of the reaction gas atoms into the test wafer surface is essentially improved.

The present invention even further relates to a method of reworking a semiconductor wafer having a distorted surface region up to a predetermined depth after its use in a method of monitoring the temperature of an RTA process in a reaction gas ambient. During the RTA process, reaction gas compounds have penetrated into the distorted surface region and formed a reaction product film. After measurement of the reaction product film thickness, the reaction product film is removed by etching. Doing this, the reaction product-free semiconductor wafer surface is exposed and the wafer can be reused for another RTA monitoring process.

The foregoing and other features, aspects and advantages of the present invention will become more apparent from the following detailed description of the present invention when taken in conjunction with the accompanying drawing.

BRIEF DESCRIPTION OF THE DRAWINGS

The invention may be understood by reference to the following description taken in conjunction with the accompanying drawings, in which like reference numerals identify like elements, and in which:

FIG. 1 depicts the relative dependency of the resulting silicon oxide thickness from the RTO process time and temperature using the conventional method and the method according to the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The process steps described below do not form a complete process flow for the monitoring of a rapid thermal anneal (RTA) process or the manufacturing of a test wafer for this monitoring. The present invention can be practiced in conjunction with RTA and implantation techniques currently used in the art, and only so much of the commonly practiced process steps are included as are necessary for an understanding of the present invention.

In accordance with the embodiment of the present invention, at first there is provided a test wafer which then is used for monitoring an RTA process and which finally is reworked for use in monitoring another RTA process. As an exemplary test wafer, a crystalline silicon substrate (c-Si-substrate) is used. The c-Si-substrate is just one substrate out of the charge of substrates on which the semiconductor devices will be fabricated, wherein the semiconductor fabrication process includes the RTA process to be monitored as one of the fabrication steps, i.e., the test wafer has identical physical characteristics as the wafers used for semiconductor fabrication, e.g., identical wafer thickness, crystal orientation, pre-doping concentration, etc. But in other semiconductor fabrication processes, other crystalline substrates which are the to basis material for the semiconductor devices may be used, e.g., GaAs-substrates or Ge-substrates.

Heavy ions are implanted at high implantation energies in one surface side of the test wafer by a conventional implantation process. Convenient heavy ions are readily available for the conventional implanter and have a mass well above the mass of each of the constituent atoms of the test wafer. In the case of a silicon test wafer, the mass of silicon (28 amu) is the crucial mass and ions as, e.g., germanium (Ge), arsenic (As), antimony (Sb), krypton (Kr), and xenon (Xe) are appropriate.

The dose of the implanted ions is in the range from about $10^{14}$ to $10^{16}$ ions/cm$^2$, preferentially from about $10^{14}$ to about $10^{15}$ ions/cm$^2$. The implantation energy to be used depends on the desired implantation depth which is selected such that the implantation depth is always higher than the expected penetration depth of reacting atoms (i.e., the expected thickness of the reaction product film) during the monitored RTA process (see detailed description below). As this is only a minimal requirement, the implantation energy may be selected from a wide range of implantation energies, e.g., a range of 50 keV to 1 MeV.

The heavy ions implanted into the crystalline substrate interact with the test wafer lattice atoms and statistically impart an impulse to the test wafer atoms so that the lattice structure is distorted. As the cross section of interaction and the imparted impulse of heavy ions is much higher than that of light ions, the dose for producing the same extent of distortion of the crystalline structure is much lower when using heavy ions as compared to light ions. As low doses of heavy ions are sufficient to produce the distorted surface region, the implant time per test wafer is kept short, so that the production costs for test wafers are low.

Thus, distorting a surface region of the crystalline semiconductor wafer means that the crystal structure is distorted on the atomic level (e.g., lattice defects and other defects) thereby improving the penetration rate of the reaction gas components from the gaseous, reaction gas containing ambient into the semiconductor wafer.

The implantation of heavy ions is accompanied by an amorphization of the lattice structure even if a relatively low dose of heavy ions of about $10^{14}$ ions/cm$^2$ is used (so-called pre-amorphization implant (PAI)). The distorted lattice structure of the crystalline wafer enhances the diffusion speed of ambient atoms penetrating into the substrate as compared with the diffusion rate in the originally undistorted lattice structure.

One or more test wafers having the distorted surface region are placed in a process chamber for performing the RTA process. The annealing of the test wafer(s) is performed under the same conditions which are set for the RTA process of the semiconductor wafers on which the semiconductor devices are formed with the exception that a reaction gas is introduced into the annealing chamber. Preferentially, an oxygen-containing gas (e.g., $N_2O$, $O_2$) is used as reaction gas during the silicon wafer RTA process to be monitored. But other gases having a high penetration rate and forming a chemical compound (silicon compound, when using silicon test wafers) under RTA conditions may be used, e.g., a hydrogen-containing gas forming SiH compounds in a silicon test wafer.

The reaction gas (e.g., oxygen-containing gas) may replace the annealing gas normally (typically nitrogen gas ($N_2$) at atmospheric pressure) used for the semiconductor annealing or the reaction gas may be mixed with other gases (e.g., 5–10% partial pressure of dinitrogen monoxide ($N_2O$) in nitrogen gas). Typical values for a representative RTA process are an annealing temperature of 1,000° C. and an annealing time of 30 seconds.

Naturally, if the RTA process step for the fabrication of the semiconductor device itself is performed in an ambient gas which contains the reaction gas (e.g., an oxygen-containing ambient gas), then no separate dummy process for monitoring the RTA process needs to be performed and one test wafer may be placed in the annealing chamber instead of one of the semiconductor device wafers in the RTA process step to be monitored.

During the RTA process, at least one component of the reacting gas (oxygen atoms when using $N_2O$) penetrate into the distorted surface region by diffusion. The diffusing components react with the atoms of the test wafer forming a reaction product composed of the reacting test wafer atom and penetrating component, e.g., silicon oxide ($SiO_2$) is formed when using an oxygen-containing ambient gas as $N_2O$ and a silicon test wafer.

The thickness of the such formed reaction product film depends on the penetration depth of the penetrating reaction gas component and thus the diffusion speed of the component within the test wafer.

In the following description it is assumed that an oxygen-containing gas is used as reaction gas and that a silicon oxide ($SiO_2$) film is formed during the RTA process of a silicon test wafer.

After completion of the RTA process, the test wafer(s) is (are) removed from the annealing chamber and the $SiO_2$ film thickness is analyzed. As the analyzing method, conventional depth profile measurement methods may be used. Preferentially, the silicon oxide thickness measurement is performed using an optical ellipsometer in combination with an xy-stepper such that the local silicon oxide thickness distribution is automatically recorded across the test wafer surface.

FIG. 1 is an illustrative example for the dependency of the resulting silicon oxide thickness from the RTO process time using the conventional method as described above and the method according to the invention using a test wafer including a distorted surface region. The solid lines RTO(T1) and RTO(T2) show the time-dependency of the oxide thickness for a conventional monitoring process in which the test wafer without distorted surface is annealed in an RTA process in an oxygen-containing ambient. Further, in FIG. 1, the dashed lines PAI(T1) and PAI(T2) show the time-dependency of the oxide thickness for a monitoring process of the pre-amorphization implanted test wafers according to the invention using identical annealing conditions as used for RTO(TI) and RTO(T2), respectively, wherein the annealing temperature T2 is higher than T1 and T1 is higher than 850° C.

The silicon oxide growth rate (resulting oxide thickness divided by the annealing time) for the pre-amorphization implant test wafer (PAI test wafer) is higher than the growth rate of the conventional RTO process by a factor which is typically in the range of 1.5 to 2.5 or more. Therefore, the error of the thickness measurement is essentially reduced and the accuracy of the RTA temperature determination is improved as the relative contribution of the measurement error is reduced.

Typically, the silicon oxide film thickness formed during the RTA process is only about 25–35 Å whereas the silicon test wafer is 800 $\mu$m thick. Only a very small amount of the test wafer material is consumed by forming the oxide film thereon. The silicon oxide film may be removed from the silicon test wafer by using an appropriate conventional etchant, e.g., dilute hydrogen fluoride (HF). However, when using reaction gases during the RTA process which do not include an oxygen component, other reaction product films are formed and respective etching methods are applicable for removing these reaction product films.

As compared to a virgin silicon substrate as test wafer, the properties of a reworked silicon test wafer are modified only to a negligible extent as only some millionth of the original silicon test wafer material has been etched away. Thus, the effect on the RTA monitoring result is negligible and the reworked test wafers still allow accurate determination of the RTA temperature.

Consequently, after removing the reaction product film (e.g., silicon oxide film) from the test wafer, thereby exposing the original material composition of the test wafer and ion implanting for pre-amorphization, the test wafer may be reused a multiple of times as a test wafer for monitoring further RTA-processes.

The above described method of monitoring the temperature of an RTA process is applicable for monitoring the local temperature homogeneity across the surface of the test wafer by measuring the reaction product film thickness at different locations on the test wafer. This method is applicable in conventional single wafer RTA process chambers as well as in multi-wafer RTA process chambers. In the latter case, the method is additionally applicable to monitor any temperature differences at two different wafer holder locations within the RTA process chamber by placing two or more test wafers at different wafer holders and comparing the reaction product film thickness of the two or more test wafers. Finally, the method is applicable to control the reproducibility of the RTA process by performing the above monitoring process in regular intervals, e.g., after performing a predetermined number is of RTA processes for manufacturing the semiconductor devices.

Unlike the conventional methods, the method of monitoring the temperature of an RTA process according to the present invention provides an increase in the penetration rate of reaction gas components (e.g., oxygen atoms) and thus an essential increase in the reaction product film thickness so that the accuracy of the reaction product film thickness measurement is improved. On the other hand, it is possible to determine the temperature and temperature homogeneity of RTA processes using a very short annealing time when the reaction product film thickness of the conventional methods is too low for a qualitative measurement.

Preferably the distorted surface region is generated by implanting heavy ions into the semiconductor surface. In this case, sufficient distortion of the crystalline lattice for an improved diffusion of the reaction gas components into the semiconductor substrate surface is already achieved at low doses. Thus, the implantation time is short and the production costs for semiconductor substrates for the use in RTA monitoring are low.

According to the present invention a test wafer is pre-amorphized using a low dose heavy ion implantation, thereby, the problem of long implantation times for producing highly doped regions in a test wafer or the problem of inaccurate reaction product film thickness measurements due to low penetration rates as in the conventional monitoring methods are eliminated. Even the problem of high test wafer consumption for monitoring purposes is overcome by providing a method for reworking the test wafers.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of monitoring the temperature of an RTA process, comprising the steps of:
    forming a distorted surface region in a semiconductor wafer comprised of a doped or undoped silicon wafer by amorphizing a region of the crystalline semiconductor wafer at least in a defined surface area of the wafer up to a predetermined depth by implanting ions selected from one of the group of Ge, As, Sb, Kr, and Xe at an implantation energy in the range of 50 keV to 1 MeV and at an implantation dose in the range from about $10^{14}$ to about $10^{16}$ ions/cm$^2$ into the crystalline semiconductor wafer;
    mounting the semiconductor wafer in a process chamber for performing the RTA process;
    performing the RTA process in a reaction gas ambient, wherein at least one component of the reaction gas penetrates into the semiconductor wafer and reacts with the semiconductor wafer material to form a reaction product film in the semiconductor wafer surface region;
    analyzing the reaction product film thickness on the semiconductor wafer; and
    removing the reaction product film to expose the underlying wafer material surface by performing an etching process.

2. The method according to claim 1, wherein the reaction gas is an oxygen-containing gas and the reaction product film is a silicon dioxide (SiO$_2$) film.

3. The method according to claim 1, wherein the reaction gas is comprised of at least one of oxygen (O$_2$) and dinitrogen monoxide (N$_2$O), and the reaction product film is a silicon dioxide (SiO$_2$) film.

4. The method according to claim 1, wherein performing an etching process to remove the reaction product film comprises performing a diluted HF acid etching process.

5. A method of monitoring the temperature of an RTA process, comprising the steps of:
    forming a distorted surface region in a semiconductor wafer by implanting ions into a substrate at an implantation energy in the range of 50 keV to 1 MeV and at an implantation dose in the range from about $10^{14}$ to about $10^{16}$ ions/cm$^2$;
    mounting the semiconductor wafer in a process chamber for performing the RTA process;
    performing the RTA process in a reaction, oxygen-containing gas ambient, wherein at least one component of the reaction gas penetrates into the semiconductor wafer and reacts with the semiconductor wafer material to form a reaction product film in the semiconductor wafer surface region;
    analyzing the reaction product film thickness on the semiconductor wafer; and
    removing the reaction product film to expose the underlying wafer material surface by performing a diluted HF acid etching process.

6. The method according to claim 5, wherein the implanted ions comprise ions selected from one of the group of Ge, As, Sb, Kr, and Xe.

7. The method according to claim 5, wherein the semiconductor wafer is a doped or undoped silicon wafer.

8. The method according to claim 5, wherein the reaction product film is a silicon dioxide (SiO$_2$) film.

9. The method according to claim 5, wherein the reaction gas is comprised of at least one of oxygen (O$_2$) and dinitrogen monoxide (N$_2$O), and the reaction product film is a silicon dioxide (SiO$_2$) film.

10. A method of monitoring the temperature of an RTA process, comprising the steps of:
    forming a distorted surface region in a semiconductor wafer comprised of a doped or undoped silicon wafer by implanting ions into a substrate at an implantation energy in the range of 50 keV to 1 MeV and at an implantation dose in the range from about $10^{14}$ to about $10^{16}$ ions/cm$^2$;
    mounting the semiconductor wafer in a process chamber for performing the RTA process;
    performing the RTA process in a reaction, oxygen-containing gas ambient, wherein at least one component of the reaction gas penetrates into the semiconductor wafer and reacts with the semiconductor wafer material to form a reaction product film comprised of silicon dioxide (SiO$_2$) in the semiconductor wafer surface region;
    analyzing the reaction product film thickness on the semiconductor wafer; and
    removing the reaction product film to expose the underlying wafer material surface by performing an etching process.

11. The method according to claim 10, wherein the implanted ions are ions selected from. one of the group of Ge, As, Sb, Kr, and Xe.

12. The method according to claim 10, wherein the reaction gas is comprised of at least one of oxygen (O$_2$) and dinitrogen monoxide (N$_2$O), and the reaction product film is a silicon dioxide (SiO$_2$) film.

13. The method according to claim 10, wherein performing an etching process to remove the reaction product film comprises performing a diluted HF acid etching process.

14. A method of monitoring the temperature of an RTA process, comprising the steps of:
    forming a distorted surface region in a semiconductor wafer by amorphizing a region of the crystalline semiconductor wafer at least in a defined surface area of the wafer up to a predetermined depth by implanting ions selected from the group of Ge, As, Sb, Kr and Xe at an implantation energy in the range of 50 keV to 1 MeV and up to a predetermined implantation dose into the crystalline semiconductor wafer;
    mounting the semiconductor wafer in a process chamber for performing the RTA process;
    performing the RTA process in a reaction gas ambient, wherein at least one component of the reaction gas penetrates into the semiconductor wafer and reacts with the semiconductor wafer material to form a reaction product film in the semiconductor wafer surface region; and analyzing the reaction product film thickness on the semiconductor wafer.

15. The method according to claim 14, wherein the implantation dose is in the range from about $10^{14}$ to about $10^{16}$ ions/cm$^2$.

16. A method of monitoring the temperature of an RTA process, comprising the steps of:

forming a distorted surface region in a semiconductor wafer;

mounting the semiconductor wafer in a process chamber for performing the RTA process;

performing the RTA process in a reaction gas ambient, wherein at least one component of the reaction gas penetrates into the semiconductor wafer and reacts with the semiconductor wafer material to form a reaction product film in the semiconductor wafer surface region;

analyzing the reaction product film thickness on the semiconductor wafer; and removing the reaction product film to expose the underlying wafer material surface by performing an etching process.

17. The method of claim 16, wherein performing an etching process to remove the reaction product film comprises performing a diluted HF acid etching process.

18. A method of monitoring the temperature of an RTA process, comprising the steps of:

forming a distorted surface region in a semiconductor wafer by implanting ions into a substrate at an implantation energy in the range of 50 keV to 1 MeV;

mounting the semiconductor wafer in a process chamber for performing the RTA process;

performing the RTA process in a reaction, oxygen-containing gas ambient, wherein at least one component of the reaction gas penetrates into the semiconductor wafer and reacts with the semiconductor wafer material to form a reaction product film in the semiconductor wafer surface region; and analyzing the reaction product film thickness on the semiconductor wafer.

19. A method of monitoring the temperature of an RTA process, comprising the steps of:

forming a distorted surface region in a semiconductor wafer by implanting ions into a substrate;

mounting the semiconductor wafer in a process chamber for performing the RTA process;

performing the RTA process in a reaction, oxygen-containing gas ambient, wherein at least one component of the reaction gas penetrates into the semiconductor wafer and reacts with the semiconductor wafer material to form a reaction product film in the semiconductor wafer surface region;

analyzing the reaction product film thickness on the semiconductor wafer; and removing the reaction product film to expose the underlying wafer material surface by performing an etching process.

20. The method of claim 19, wherein performing an etching process to remove the reaction product film comprises performing a diluted HF acid etching process.

21. A method of monitoring the temperature of an RTA process, comprising the steps of:

forming a distorted surface region in a semiconductor wafer by implanting ions into a substrate at an implantation energy in the range of 50 keV to 1 MeV;

mounting the semiconductor wafer in a process chamber for performing the RTA process;

performing the RTA process in a reaction, oxygen-containing gas ambient, wherein at least one component of the reaction gas penetrates into the semiconductor wafer and reacts with the semiconductor wafer material to form a reaction product film comprised of silicon dioxide (SiO$_2$) in the semiconductor wafer surface region;

analyzing the reaction product film thickness on the semiconductor wafer; and removing the reaction product film to expose the underlying wafer material surface by performing an etching process.

22. A method of monitoring the temperature of an RTA process, comprising the steps of:

forming a distorted surface region in a semiconductor wafer by implanting ions into a substrate;

mounting the semiconductor wafer in a process chamber for performing the RTA process;

performing the RTA process in a reaction, oxygen-containing gas ambient, wherein at least one component of the reaction gas penetrates into the semiconductor wafer and reacts with the semiconductor wafer material to form a reaction product film comprised of silicon dioxide (SiO$_2$) in the semiconductor wafer surface region;

analyzing the reaction product film thickness on the semiconductor wafer; and removing the reaction product film to expose the underlying Wafer material surface by performing a diluted HF acid etching process.

* * * * *